(12) United States Patent
Ou et al.

(10) Patent No.: US 11,165,940 B2
(45) Date of Patent: Nov. 2, 2021

(54) IMAGE CAPTURING MODULE HAVING TWO LIGHT-SHIELDING ADHESIVE LAYERS CLOSING TWO NOTCHES LOCATED ON LENS BASE, AND MANUFACTURING METHOD THEREOF

(71) Applicant: Chicony Electronics Co., Ltd., New Taipei (TW)

(72) Inventors: Chien-Chung Ou, New Taipei (TW); Cheng-Hun Yang, New Taipei (TW)

(73) Assignee: CHICONY ELECTRONICS CO., LTD., New Taipei (TW)

( * ) Notice: Subject to any disclaimer, the term of this patent is extended or adjusted under 35 U.S.C. 154(b) by 26 days.

(21) Appl. No.: 16/685,028

(22) Filed: Nov. 15, 2019

(65) Prior Publication Data

US 2020/0344390 A1  Oct. 29, 2020

(30) Foreign Application Priority Data

Apr. 24, 2019 (TW) .................................. 108114390

(51) Int. Cl.
*H04N 5/225* (2006.01)
*H05K 1/18* (2006.01)

(52) U.S. Cl.
CPC ......... *H04N 5/2254* (2013.01); *H04N 5/2253* (2013.01); *H04N 5/2257* (2013.01); *H05K 1/181* (2013.01); *H05K 2201/10121* (2013.01); *H05K 2201/10151* (2013.01)

(58) Field of Classification Search
CPC .. H04N 5/2254; H04N 5/2257; H04N 5/2253; H05K 1/181; H05K 2201/10151; H05K 2201/10121
See application file for complete search history.

(56) References Cited

U.S. PATENT DOCUMENTS

| 7,929,052 | B2 * | 4/2011 | Chen | ...................... | G03B 17/12 |
| | | | | | 348/374 |
| 2008/0246845 | A1 | 10/2008 | Chan | | |
| 2009/0033789 | A1 * | 2/2009 | Lin | .......................... | G02B 7/02 |
| | | | | | 348/374 |

(Continued)

FOREIGN PATENT DOCUMENTS

| CN | 101281284 A | 10/2018 |
| CN | 109257531 A | 1/2019 |
| TW | 201902198 A | 1/2019 |

*Primary Examiner* — Luong T Nguyen
(74) *Attorney, Agent, or Firm* — Muncy, Geissler, Olds & Lowe, P.C.

(57) ABSTRACT

An image capturing module includes a long circuit board, a lens base, and two light-shielding adhesive layers. The long circuit board includes a surface having an assembly area. The assembly area has two opposite long sides and two opposite short sides. The assembly area is provided with a light sensor. The two long sides are separated by a specific width. The lens base includes a substrate and two side plates. The two side plates are connected to opposite sides of the substrate and are respectively fixed on the two short sides of the assembly area. A specific spacing is maintained between the substrate and the assembly area to form two notches between the two long sides and the substrate. The width of the substrate and each of the side plates is less than or equal to the specific width. The two light-shielding adhesive layers respectively close the two notches.

8 Claims, 6 Drawing Sheets

(56) References Cited

U.S. PATENT DOCUMENTS

| | | | |
|---|---|---|---|
| 2011/0149143 A1* | 6/2011 | Tsujino | G02B 7/021 |
| | | | 348/374 |
| 2018/0031751 A1* | 2/2018 | Sugiyama | G02B 6/0051 |
| 2018/0081143 A1* | 3/2018 | Shimono | H04N 5/2253 |
| 2018/0324337 A1* | 11/2018 | Yoshikawa | H04N 5/2253 |
| 2019/0088699 A1* | 3/2019 | Shen | H01L 27/14625 |
| 2019/0174032 A1* | 6/2019 | Yang | G02B 7/021 |
| 2019/0369431 A1* | 12/2019 | Chan | G02F 1/13394 |

\* cited by examiner

ICE CAPTURING MODULE HAVING
TWO LIGHT-SHIELDING ADHESIVE
LAYERS CLOSING TWO NOTCHES
LOCATED ON LENS BASE, AND
MANUFACTURING METHOD THEREOF

CROSS-REFERENCE TO RELATED
APPLICATION

This non-provisional application claims priority under 35 U.S.C. § 119(a) to Patent Application No. 108114390 filed in Taiwan, R.O.C. on Apr. 24, 2019, the entire contents of which are hereby incorporated by reference.

BACKGROUND

Technical Field

The instant disclosure relates to an image capturing module and, more particularly, to an image capturing module and manufacturing method thereof.

Related Art

For a screen of a mobile device (e.g., a tablet computer or a laptop computer), the narrower the overall width of the screen frame, the higher the screen ratio of the screen is (that is, the more the display area of the screen is), which can bring a wider visual effect and can make the body of the mobile device lighter.

Nonetheless, the width of the screen frame of the mobile device available on the market is always limited by the overall width of the image module and cannot be further narrowed. In particular, the image module at present is generally installed in the screen frame and includes a circuit board and a lens base. The surface of the circuit board is provided with a light sensor. The lens base is of a cover shape to cover the outside of the light sensor, so as to make the light sensor enclosed in the cover. Therefore, the overall width of the image module is limited by the width of the lens base, such that the screen frame cannot be narrowed.

SUMMARY

To address the above issue, in an embodiment, an image capturing module is provided, which comprises a long circuit board, a lens base, and two light-shielding adhesive layers. The long circuit board comprises a surface having an assembly area. The assembly area has two opposite long sides and two opposite short sides. The assembly area is provided with a light sensor. The two long sides are separated by a specific width. The lens base comprises a substrate and two side plates. The two side plates are connected to opposite sides of the substrate and are respectively fixed on the two short sides of the assembly area. A specific spacing is maintained between the substrate and the assembly area to form two notches between the two long sides and the substrate. The width of the substrate and each of the side plates is less than or equal to the specific width. The two light-shielding adhesive layers respectively close the two notches.

In an embodiment, a manufacturing method of an image capturing module is provided, which comprises: preparing a long circuit board, wherein the long circuit board comprising a surface having an assembly area, the assembly area has two opposite long sides and two opposite short sides, the assembly area is provided with a light sensor, and the two long sides are separated by a specific width; fixing a lens base on the assembly area of the long circuit board, wherein the lens base comprises a substrate and two side plates, the two side plates are connected to opposite sides of the substrate and are respectively fixed on the two short sides of the assembly area, a specific spacing is maintained between the substrate and the assembly area to form two notches between the two long sides and the substrate, and the width of the substrate and each of the side plates is less than or equal to the specific width; and closing the two notches by two light-shielding adhesive layers respectively.

Concisely, according to the embodiments of the instant disclosure of the image capturing module and the manufacturing method thereof, the lens base are disposed on the assembly area, and the width of the substrate and each of the side plates of the lens base is less than or equal to the specific width of the assembly area of the long circuit board, which can make the image capturing module to be further narrowed as a whole. In a case that the image capturing module is applied to a mobile device (e.g., a laptop computer), a narrower screen frame can be adopted to increase a display area of a screen and to increase the screen ratio and reduce the weight of the mobile device.

DETAILED DESCRIPTION

Figure 1:
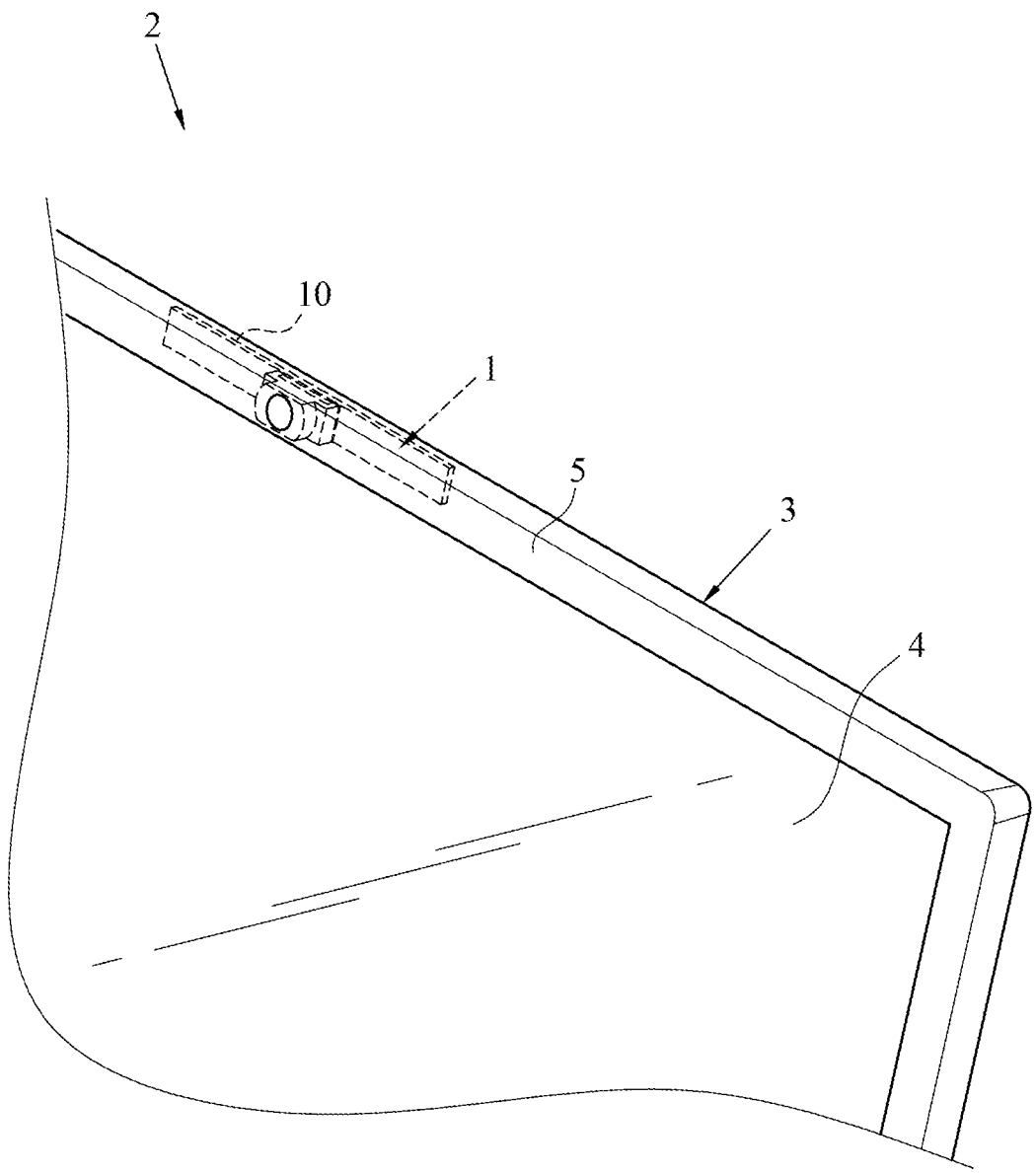
FIG. 1 illustrates a schematic diagram of a practicing of an image capturing module according to an embodiment of the instant disclosure.
Figure 2:
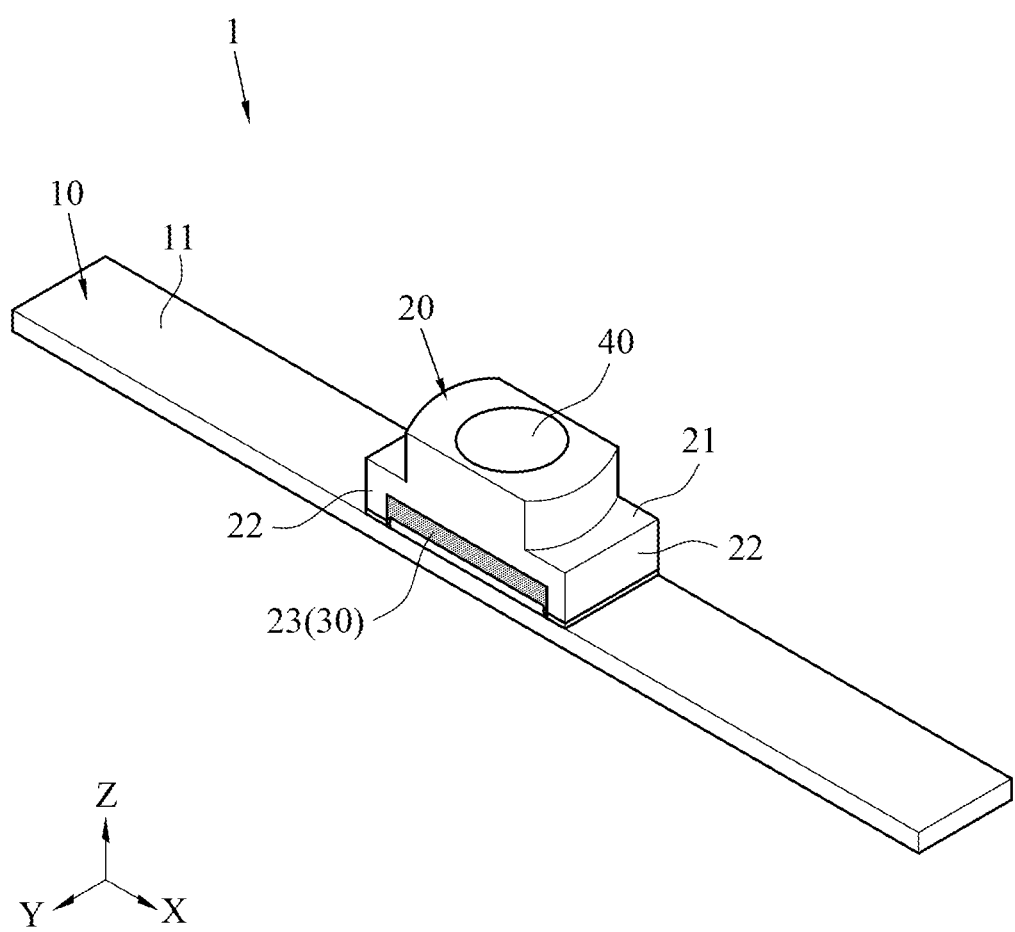
FIG. 2 illustrates a perspective view of the image capturing module according to an embodiment of the instant disclosure.
Figure 3:
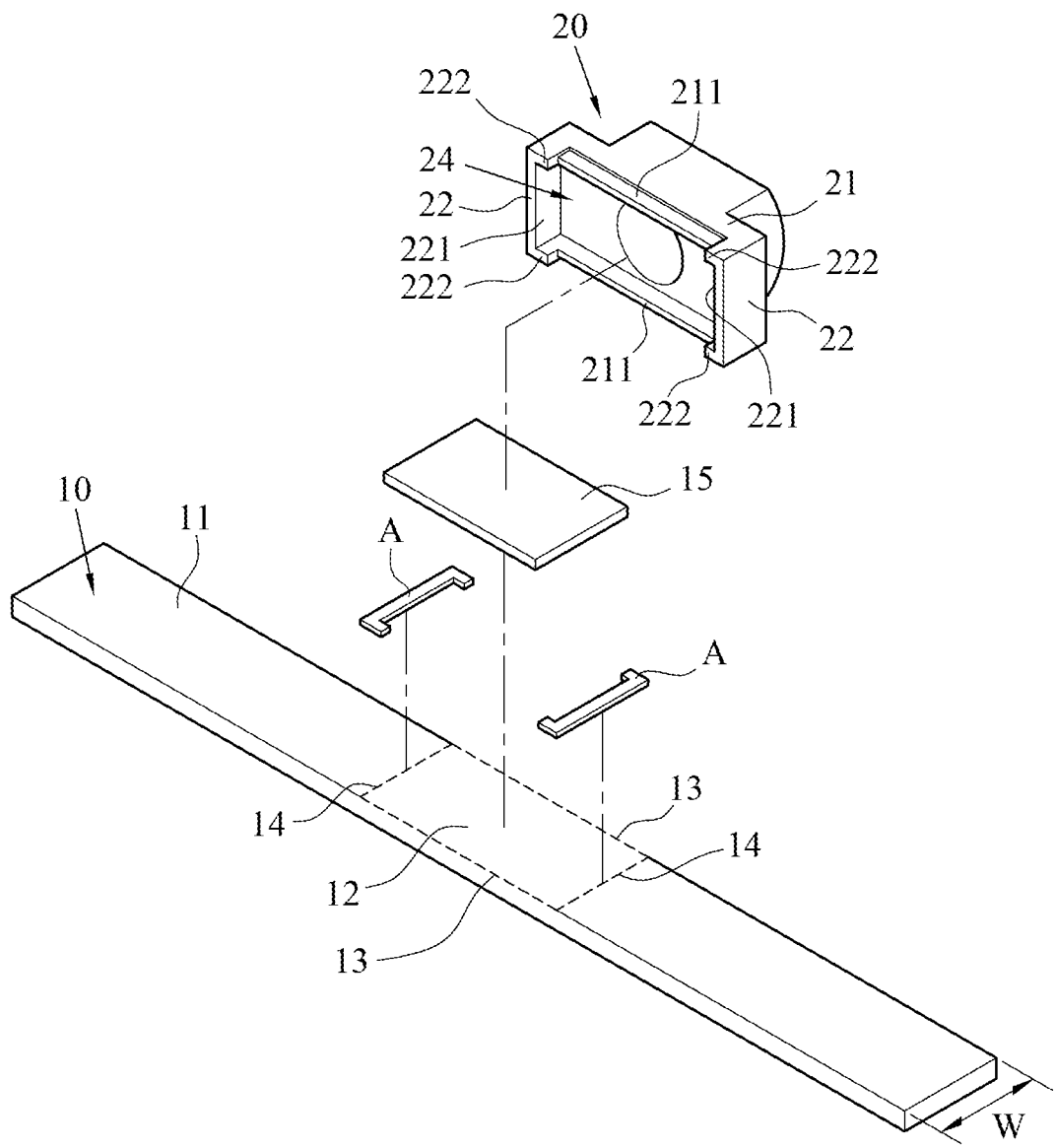
FIG. 3 illustrates an exploded view of the image capturing module according to an embodiment of the instant disclosure.

FIG. 1 is a schematic diagram of a practicing of an image capturing module according to an embodiment of the instant disclosure. FIG. 2 is a perspective view of the image capturing module according to an embodiment of the instant disclosure. FIG. 3 is an exploded view of the image capturing module according to an embodiment of the instant disclosure. As shown in FIG. 1 and FIG. 2, the image capturing module 1 includes a long circuit board 10, a lens base 20, and two light-shielding adhesive layers 30. In some embodiments, the image capturing module 1 can be applied to a mobile device to enable the mobile device to support functions such as image record, network video communication, or face recognition. For example, the image capturing module 1 can be applied to a mobile device such as a tablet computer or a laptop computer. As shown in FIG. 1, in the embodiment, a mobile device 2 comprises a screen 3. The screen 3 has a display area 4 and a frame 5. The frame 5 is disposed on a side of the display area 4 or around the display area 4. The image capturing module 1 is installed in the inside of the frame 5. Therefore, the overall width of the image capturing module 1 will affect the narrowness of the frame 5. That is, the narrower the overall width design of the image capturing module 1 is, the narrower frame 5 the mobile device 2 can adopt to increase the display area 4 of the screen 3.

As shown in FIG. 1 to FIG. 3, the long circuit board 10 has an elongated shape in the embodiment to be disposed along the frame 5 of the screen 3. The long circuit board 10 comprises a surface 11. The surface 11 has an assembly area 12. The assembly area 12 is an area on the surface 11 of the long circuit board 10 to which the lens base 20 can be correspondingly assembled (for example, a dotted window area in FIG. 3). In the embodiment, the assembly area 12 has a rectangular shape and has two opposite long sides 13 and two opposite short sides 14. The two long sides 13 are separated by a specific width W. Since the size of the assembly area 12 depends on the size of a light sensor 15, the specific width W is the width of each light sensor 15 with respect to the assembly area 12. While the specific width W of the assembly area 12 is smaller, the overall width of the long circuit board 10 can be made narrower.

As shown in FIG. 3, the light sensor 15 is provided in the assembly area 12 of the long circuit board 10. Wherein the coverage area of the light sensor 15 is smaller than that of the assembly area 12 and thus the light sensor 15 can be located in the assembly area 12, such that the edge of the light sensor 15 does not exceed the edges of the two long sides 13. For example, in the embodiment, the edge of the light sensor 15 is aligned with the edge of the two long sides 13 of the assembly area 12, but it is not limited thereto. In some embodiments, the light sensor 15 may be a charge-coupled device (CCD), a complementary metal-oxide semiconductor (CMOS), or a complementary metal oxide semiconductor active pixel sensor (CMOS Active pixel sensor).

As shown in FIG. 1 to FIG. 3, the lens base 20 comprises a substrate 21 and two side plates 22. The two side plates 22 are connected to two opposite sides of the substrate 21. The lens base 20 as a whole has a U-shaped and forms a hollow portion 24 between the substrate 21 and the two side plates 22. Wherein a lens 40 is disposed on the substrate 21, and the edge of the lens 40 does not exceed the edge of the substrate 21. In the embodiment, the lens base 20 has a rectangular shape corresponding to the shape of the assembly area 12, but it is not limited thereto. The two side plates 22 of the lens base 20 are respectively fixed on the two short sides 13 of the assembly area 12. A specific spacing S is maintained between the substrate 21 and the assembly area 12 (please refer to FIG. 5) to form two notches 23 between the two long sides 13 and the substrate 21. And the width of the substrate 21 and each of the side plates 22 is less than or equal to the specific width W of the assembly area 12 (wherein the width of the substrate 21 and each side plate 22 is equal to the specific width W). The two light-shielding adhesive layers 30 respectively close the two notches 23. The following is a detailed description of a manufacturing process of the image capturing module 1 of the embodiment of the instant disclosure.

Figure 7:
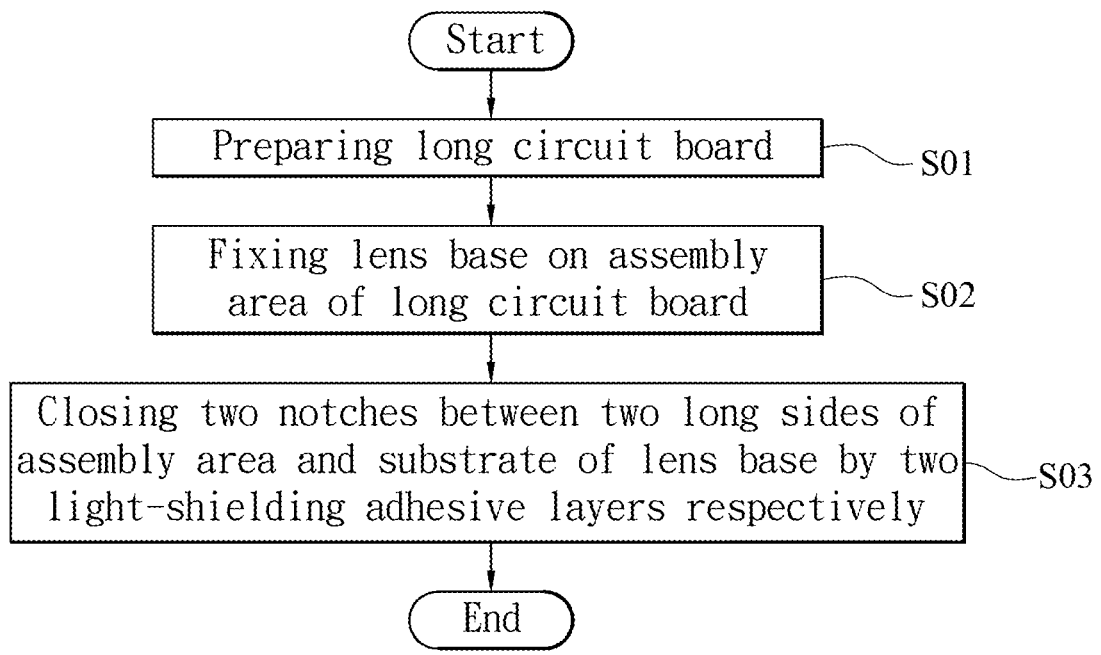
FIG. 7 illustrates a flow chart of a manufacturing method of an image capturing module according to an embodiment of the instant disclosure.

FIG. 7 is a flow chart of a manufacturing method of an image capturing module according to an embodiment of the instant disclosure. The following description of hardware structure can be referred to the disclosure of the embodiments of FIG. 2 to FIG. 5, but it is not intended to limit the present invention. As shown in FIG. 7, in step S01, a long circuit board 10 is prepared. Please refer to FIG. 3. The light sensor 15 is preliminarily assembled in the assembly area 12 of the long circuit board 10.

As shown in FIG. 7, after step S01, step S02: fixing the lens base 20 to the assembly area 12 of the long circuit board 10 is performed. Specifically, as shown in FIG. 3, the bottom surfaces of the two side plates 22 of the lens base 20 can be respectively fixed to the two short sides 14 of the assembly area 12, such that the light sensor 15 is located in the hollow portion 24 formed between the substrate 21 and the two side plates 22. The width of the substrate 21 and each of the side plates 22 is equal to the specific width W. That is, the edges of the substrate 21 and each side plate 22 do not exceed the edges of the two long sides 13 of the assembly area 12.

Figure 4:
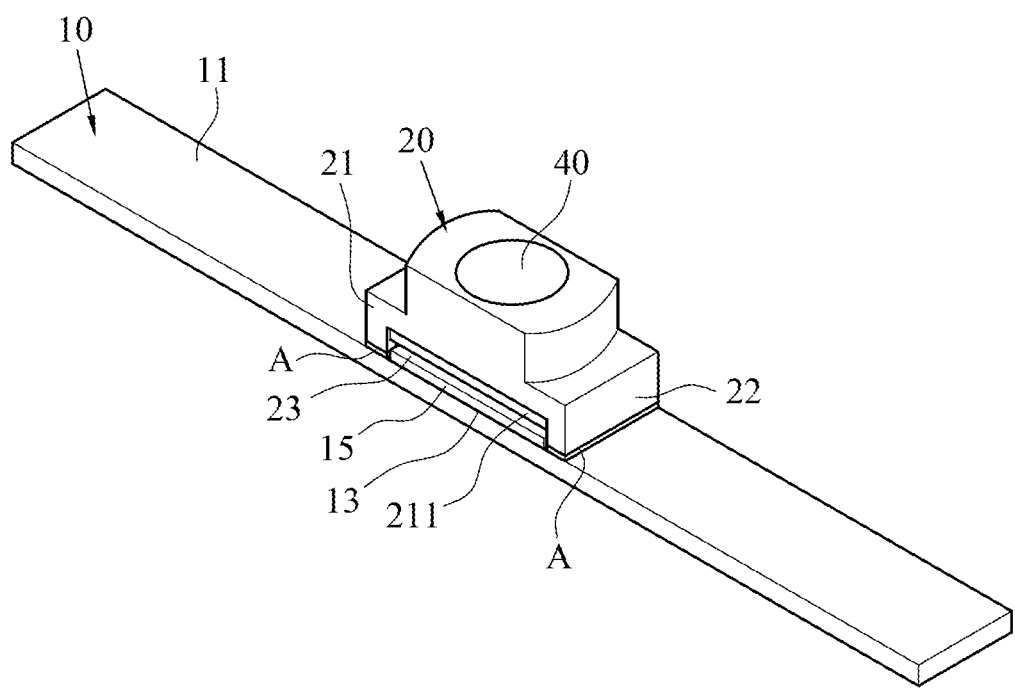
FIG. 4 illustrates a perspective view of an assembling process of the image capturing module according to an embodiment of the instant disclosure.
Figure 5:
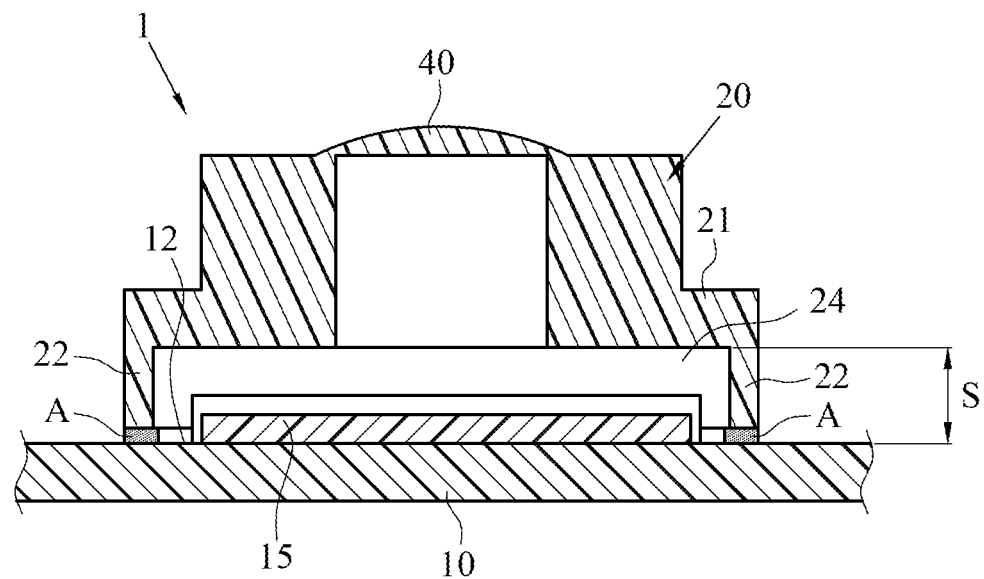
FIG. 5 illustrates a cross sectional view of the image capturing module according to an embodiment of the instant disclosure.

In addition, please refer to FIG. 5. FIG. 5 is a cross sectional view of the image capturing module 1 of FIG. 2 along the X-axis direction. Since the two side plates 22 have a certain height, the specific spacing S can be maintained between the substrate 21 and the assembly area 12. The lens 40 on the substrate 21 further corresponds to the light sensor 15. In addition, as shown in FIG. 4, after the lens base 20 is fixed above the assembly area 12 of the long circuit board 10, since the specific spacing S is maintained between the substrate 21 and the assembly area 12, the two notches 23 can be formed between the substrate 21 and the two long sides 13. And the two notches 23 are communicated with the hollow portion 24 formed between the substrate 21 and the two side plates 22. That is, one of the long sides 13 of the assembly area 12, the substrate 21, and the two side plates 22 surround to form one notch 23, and the other one of the long sides 13 of the assembly area 12, the substrate 21, and the two side plates 22 surround to form the other one notch 23.

Figure 6:
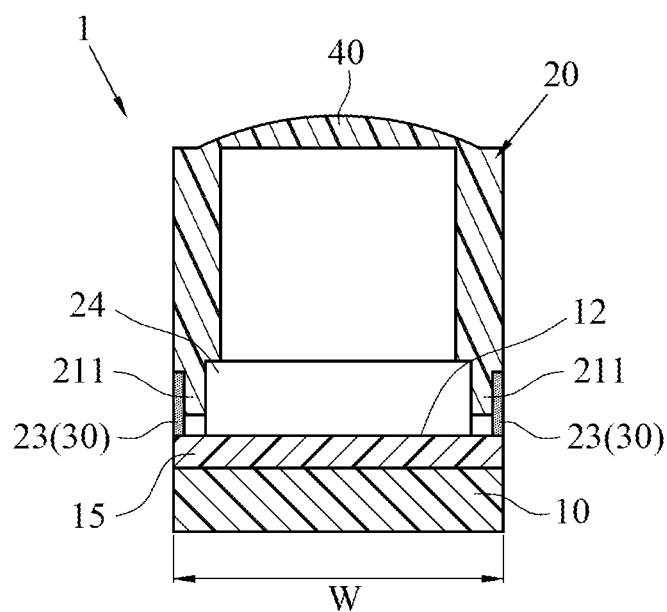
FIG. 6 illustrates another cross sectional view of the image capturing module according to an embodiment of the instant disclosure.

As shown in FIG. 7, after step S02, step S03: closing the two notches 23 by the two light-shielding adhesive layers 30 respectively is performed. FIG. 6 is a cross sectional view of the image capturing module 1 of FIG. 2 along the Y-axis direction. After the lens base 20 is fixed on the assembly area 12 of the long circuit board 10, the two notches 23 can be filled with light-shielding adhesives to form the two light-shielding adhesive layers 30 to close the notches 23 by the light-shielding adhesive layers 30, so as to prevent the external light from entering the two notches 23 and affecting the light sensing effect of the light sensor 15. And each of the light-shielding adhesive layers 30 also enhances the fixing effect between the lens base 20 and the assembly area 12 of the long circuit board 10. In some embodiments, the light-shielding adhesive layer 30 is a dark adhesive layer. For example, the light-shielding adhesive layer 30 may be an adhesive layer with black, coffee or brown color to shield light. In addition, in some embodiments, the light-shielding layer 30 can be a waterproof light-shielding layer with a waterproof effect. For example, the light-shielding layer 30 is a dark, waterproof adhesive layer to prevent external moisture from entering, which will cause the light sensor 15 to be damp.

As a result, according to the embodiment of the instant disclosure, the lens base 20 is fixed above the assembly area 12, and the two notches 23 of the lens base 20 on the two long sides 13 are closed by the light-shielding adhesive layer 30, such that the wall thickness of the opposite side walls of the lens base 20 close to the two long sides 13 is reduced at least compared to the conventional lens base, and the width of the lens base 20 is significantly reduced. In addition, the overall width of the lens base 20 is less than or equal to the specific width W of the assembly area 12 of the long circuit board 10. That is, with the narrowing of the lens base 20, the width of the space of the assembly area 12 of the long circuit board 10 can be further reduced to make the image capturing module 1 as a whole narrower. Therefore, as shown in FIG. 1, while the image capturing module 1 is applied to the mobile device 2 (e.g., a laptop computer), a narrower screen frame 5 can be adopted to increase the display area 4 of the screen 3 to increase the screen ratio, such that the weight of the mobile device 2 is reduced.

In some embodiments, as shown in FIG. 3 and FIG. 6, the substrate 21 of the lens base 20 further extends towards the assembly area 12 with two adhesive-blocking plates 211. The two adhesive-blocking plates 211 are respectively adjacent to the two notches 23. Thereby, in the process of forming the two light-shielding adhesive layers 30 by the light-shielding adhesives filled in the two notches 23, the two adhesive-blocking plates 211 can block the inflow of the light-shielding adhesives to prevent the light-shielding adhesives from affecting the light sensing effect of the light sensor 15.

In some embodiments, as shown in FIG. 3, each side plate 22 of the lens base 20 has an inner surface 221. Each inner surface 221 extends towards the light sensor 15 with at least one reinforcing plate 222. In the embodiment, two ends of each inner surface 221 close to the two long sides 13 of the assembly area 12 both extend integrally with the reinforcing plates 222. In step S02 of FIG. 7, each reinforcing plate 222 and each side plate 22 are fixed to the assembly area 12 of the long circuit board 10 together. As a result, the area for assembling between the lens base 20 and the assembly area 12 can be increased to further enhance the fixing effect without increasing the overall width of the lens base 20.

Figure 8:
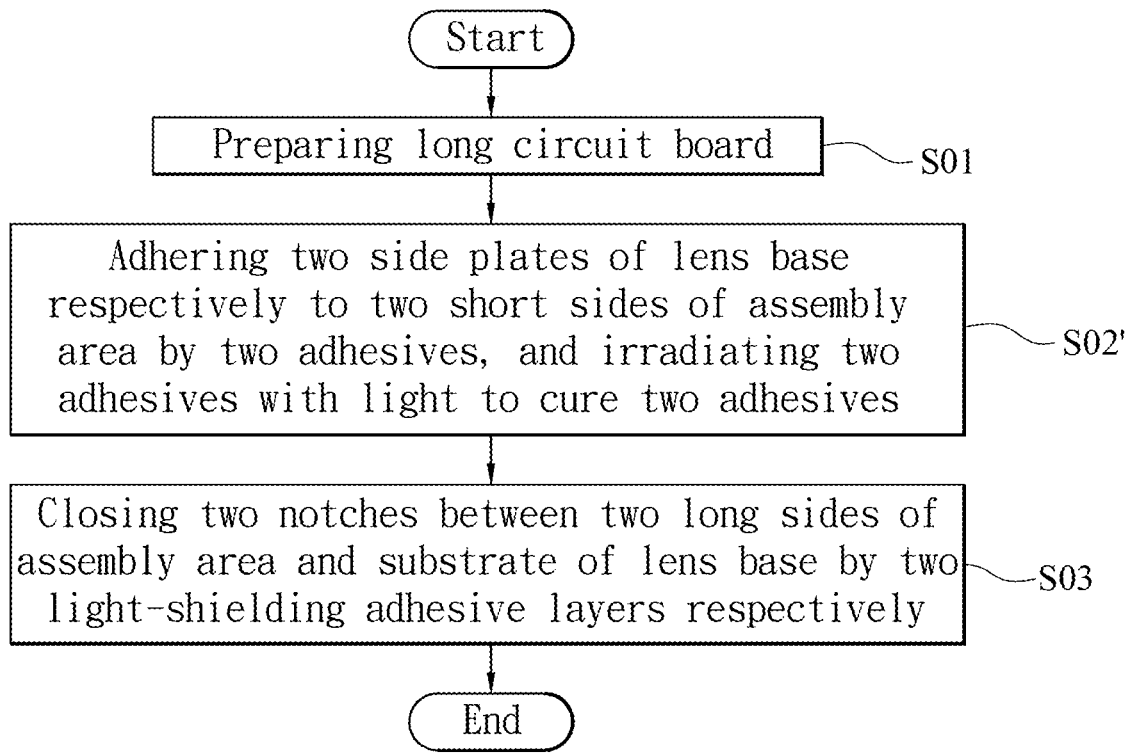
FIG. 8 illustrates a flow chart of a manufacturing method of an image capturing module according to another embodiment of the instant disclosure.

As shown in FIG. 8, it is a flow chart of a manufacturing method of an image capturing module according to another embodiment of the instant disclosure. The difference between the embodiment and the embodiment of FIG. 7 is that, in the embodiment, after step S01, step S02' is performed, which comprises: adhering the two side plates 22 of the lens base 20 respectively to the two short sides 14 of the assembly area 12 by two adhesives A, and then irradiating the two adhesives A with light to cure the two adhesives A. Please refer to FIG. 3 and FIG. 5. In some embodiments, each adhesive A may be a photo-curing adhesive (e.g., an ultraviolet curing adhesive). The bottom surfaces of the two side plates 22 of the lens base 20 and a bottom surface of each reinforcing plate 222 can be adhered to the two short sides 14 of the assembly area 12 via the two adhesives A respectively. In the meantime, the adhesives A are not irradiated with light and are not yet cured. Therefore, the position of the lens base 20 can still be adjusted relative to the long circuit board 10. For instance, the lens base 20 can be clamped by a robot arm (not shown), and the lens base 20 can be controlled to move such as lifting, traversing, pitching, deflecting or rolling relative to the long circuit board 10 by the robot arm, to maintain the predetermined imaging focal length by adjusting the relative position of the lens base 20 and the light sensor 15. As shown in FIG. 4 and FIG. 8, after the adjustment of the lens base 20 is done, each adhesive A can be irradiated by a specific light (e.g., ultraviolet light) to cure the adhesive A, thereby fixing the lens base 20 on the assembly area 12. Then, the two notches 23 are respectively closed by the two light-shielding adhesive layers 30 (step S03 of FIG. 8). The manufacturing process of the image capturing module 1 is completed.

While the instant disclosure has been described by way of example and in terms of the preferred embodiments, it is to be understood that the instant disclosure needs not be limited to the disclosed embodiments. For anyone skilled in the art, various modifications and improvements within the spirit of the instant disclosure are covered under the scope of the instant disclosure. The covered scope of the instant disclosure is based on the appended claims.

What is claimed is:

1. An image capturing module, comprising:
   a long circuit board comprising a surface having an assembly area, the assembly area having two opposite long sides and two opposite short sides, the assembly area being provided with a light sensor, and the two opposite long sides being separated by a specific width;
   a lens base comprising a substrate and two side plates, the two side plates being connected to opposite sides of the substrate and being respectively fixed on the two opposite short sides of the assembly area, a specific spacing being maintained between the substrate and the assembly area to form two notches between the two opposite long sides and the substrate, and the width of the substrate and each of the two side plates being less than or equal to the specific width; and
   two light-shielding adhesive layers respectively closing the two notches,
   wherein the two notches are communicated with a hollow portion formed between the substrate and the two side plates, one of the two opposite long sides of the assembly area, the substrate, and the two side plates surround to form one of the two notches, and the other one of the two opposite long sides of the assembly area, the substrate, and the two side plates surround to form the other one of the two notches, and
   wherein each of the two side plates has an inner surface, the inner surface extends towards the light sensor with a reinforcing plate, and the reinforcing plate is fixed to the assembly area of the long circuit board.

2. The image capturing module of claim 1, wherein the substrate of the lens base further extends towards the assembly area with two adhesive-blocking plates, and the two adhesive-blocking plates are respectively adjacent to the two notches.

3. The image capturing module of claim 1, wherein each of the two light-shielding adhesive layers is a waterproof light-shielding adhesive layer.

4. The image capturing module of claim 1, wherein each of the two light-shielding adhesive layers is a dark adhesive layer.

5. A manufacturing method of an image capturing module, comprising:
   (a) preparing a long circuit board, wherein the long circuit board comprising a surface having an assembly area, the assembly area has two opposite long sides and two opposite short sides, the assembly area is provided with a light sensor, and the two opposite long sides are separated by a specific width;
   (b) fixing a lens base on the assembly area of the long circuit board, wherein the lens base comprises a substrate and two side plates, the two side plates are connected to opposite sides of the substrate and are respectively fixed on the two opposite short sides of the assembly area, a specific spacing is maintained between the substrate and the assembly area to form two notches between the two opposite long sides and the substrate, and the width of the substrate and each of the two side plates is less than or equal to the specific width, wherein the two notches are communicated with a hollow portion formed between the substrate and the two side plates, one of the two opposite long sides of the assembly area, the substrate, and the two side plates surround to form one of the two notches, and the other one of the two opposite long sides of the assembly area, the substrate, and the two side plates surround to form the other one of the two notches, each of the two side plates has an inner surface, and the inner surface extends towards the light sensor with a reinforcing plate, and the reinforcing plate is fixed to the assembly area of the long circuit board; and (c) closing the two notches by two light-shielding adhesive layers respectively.

6. The manufacturing method of an image capturing module of claim 5, wherein in the step (b), the two side plates of the lens base are respectively adhered to the two opposite short sides of the assembly area by two adhesives, and the two adhesives are irradiated with a light to cure the two adhesives.

7. The manufacturing method of an image capturing module of claim 5, wherein in the step (b), the substrate of the lens base further extends towards the assembly area with two adhesive-blocking plates, and the two adhesive-blocking plates are respectively adjacent to the two notches.

8. The manufacturing method of an image capturing module of claim 5, wherein in the step (c), each of the two light-shielding adhesive layers is a waterproof light-shielding adhesive layer.

* * * * *